United States Patent
Ziegler et al.

(10) Patent No.: US 9,590,126 B2
(45) Date of Patent: Mar. 7, 2017

(54) SOLAR CELL ASSEMBLY II

(75) Inventors: Martin Ziegler, Freiburg (DE); Sascha Van Riesen, Freiburg (DE)

(73) Assignee: Soitec Solar GmbH, Freiburg (DE)

( * ) Notice: Subject to any disclaimer, the term of this patent is extended or adjusted under 35 U.S.C. 154(b) by 0 days.

(21) Appl. No.: 13/575,281

(22) PCT Filed: Feb. 23, 2011

(86) PCT No.: PCT/EP2011/000885
§ 371 (c)(1),
(2), (4) Date: Jul. 25, 2012

(87) PCT Pub. No.: WO2011/104016
PCT Pub. Date: Sep. 1, 2011

(65) Prior Publication Data
US 2012/0285530 A1 Nov. 15, 2012

(30) Foreign Application Priority Data
Feb. 25, 2010 (EP) .................................. 10001966

(51) Int. Cl.
*H01L 31/18* (2006.01)
*H01L 31/052* (2014.01)
*H01L 31/0224* (2006.01)

(52) U.S. Cl.
CPC ............ *H01L 31/052* (2013.01); *Y02E 10/50* (2013.01)

(58) Field of Classification Search
CPC ... H01L 31/0224; H01L 31/18; H01L 31/052; H01L 31/024; H01L 27/0296; H01L 31/02016; H01L 31/022433
USPC ..................... 136/256, 64; 438/64
See application file for complete search history.

(56) References Cited

U.S. PATENT DOCUMENTS

| | | | | |
|---|---|---|---|---|
| 3,641,346 A | * | 2/1972 | Lachambre | 374/32 |
| 5,118,361 A | | 6/1992 | Frans et al. | 136/246 |
| 5,366,692 A | * | 11/1994 | Ogashiwa | 420/565 |
| 5,460,659 A | * | 10/1995 | Krut | 136/246 |
| 6,395,972 B1 | | 5/2002 | Tran et al. | 136/251 |
| 6,586,826 B1 | * | 7/2003 | Glenn et al. | 257/686 |
| 7,977,567 B2 | * | 7/2011 | Bett et al. | 136/244 |
| 2001/0042913 A1 | * | 11/2001 | Fukuda et al. | 257/697 |
| 2002/0140079 A1 | | 10/2002 | Takeyama | 257/698 |

(Continued)

FOREIGN PATENT DOCUMENTS

DE 10 2007 001403 A1 9/2008
EP 2 110 863 A1 10/2009

(Continued)

OTHER PUBLICATIONS

International Search Report, PCT/EP2011/000885, mailed Jul. 1, 2011.

*Primary Examiner* — Jennifer Michener
*Assistant Examiner* — Bethany L Martin
(74) *Attorney, Agent, or Firm* — TraskBritt

(57) ABSTRACT

The present invention relates to a solar cell assembly that includes a solar cell attached to a bonding pad and a cooling substrate, wherein the bonding pad is attached to a surface of the cooling substrate by a thermally conductive adhesive and electrically contacted to the bonding pad and cooling substrate by a bonding wire. Alternatively, the bonding pad is attached to a surface of the cooling substrate by a thermally and electrically conductive adhesive.

9 Claims, 5 Drawing Sheets

(56) References Cited

U.S. PATENT DOCUMENTS

| | | | |
|---|---|---|---|
| 2002/0167064 A1 | 11/2002 | Takeyama | 257/459 |
| 2003/0189250 A1* | 10/2003 | Jin et al. | 257/737 |
| 2004/0025932 A1* | 2/2004 | Husher | 136/256 |
| 2004/0099961 A1* | 5/2004 | Chu et al. | 257/781 |
| 2005/0009236 A1* | 1/2005 | Ball | 438/113 |
| 2007/0215204 A1* | 9/2007 | Maehara | 136/256 |
| 2008/0090943 A1* | 4/2008 | Xu et al. | 523/461 |
| 2008/0283408 A1* | 11/2008 | Nishizawa | 205/316 |
| 2009/0272427 A1* | 11/2009 | Bett | H01L 25/041 136/249 |
| 2009/0283220 A1* | 11/2009 | Chen | 156/566 |
| 2009/0294158 A1* | 12/2009 | Matsushima | H01L 23/49816 174/257 |
| 2010/0050428 A1* | 3/2010 | Becker et al. | 29/825 |
| 2010/0089435 A1* | 4/2010 | Lockenhoff | 136/246 |
| 2010/0212942 A1* | 8/2010 | Tuan | H01L 23/3735 174/257 |
| 2010/0320582 A1* | 12/2010 | Pagaila et al. | 257/686 |
| 2011/0048501 A1* | 3/2011 | Jaus et al. | 136/246 |
| 2011/0232725 A1* | 9/2011 | Wan | H01L 31/02008 136/251 |
| 2012/0298202 A1* | 11/2012 | Ziegler et al. | 136/259 |

FOREIGN PATENT DOCUMENTS

| | | | | |
|---|---|---|---|---|
| WO | WO2008107205 | * | 9/2008 | H01L 31/02 |
| WO | WO2009143931 | * | 12/2009 | H01L 31/052 |

* cited by examiner

SOLAR CELL ASSEMBLY II

This application is a §371 filing of International Patent Application PCT/EP2011/000885, filed Feb. 23, 2011.

FIELD OF INVENTION

The present invention relates to a solar cell assembly and the manufacture of the same, and particularly the invention relates to a solar cell assembly comprising a cooling substrate and a bonding pad for the attachment of a solar cell.

BACKGROUND OF THE INVENTION

Photovoltaic or solar cells are designed for converting the solar radiation to electrical current. In concentrator solar photovoltaic applications the incoming sun light is optically concentrated before it is directed to solar cells. For example, the incoming sun light is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example.

The solar cell comprises a semiconductor integrated circuit die and therefore requires some manner of integrated circuit package or solar cell assembly, wherein the solar cell is connected to one or more functional devices. The solar cell assembly (SCA) may particularly provide environmental protection, heat dissipation and electrical connectivity to the solar cell.

In the art, SCAs are manufactured on a continuous single substrate base or comprise multiple components that are electrically isolated from each other. A critical issue is the backside contacting of the solar cell with the substrate of the SCA. Conventionally, a continuous single substrate functioning as a cooling substrate is contacted to the backside of a solar cell by means of a selective noble metal (e.g., gold) deposition that represents a tedious and time-consuming, as well as expensive processing step.

The provision of a number of electrically isolating material elements results in poor thermal conductivity and, thus, an inefficient overall thermal connection of the solar cell. Moreover, provision of materials of different material characteristics implies higher expenses and a plurality of connection regions and, therefore, results in a significant deterioration of the (long-life) reliability of the manufactured SCA.

Thus, despite the recent engineering progress there is still a need for providing an SCA that shows reliable electrical contacting, efficient thermal conductivity and resistance against aging without increasing costs and, moreover, taking into account production rationalization.

SUMMARY OF THE INVENTION

The present invention addresses the above-mentioned need and, accordingly, provides a method for the manufacture of a solar cell assembly (SCA) comprising the steps of providing a solar cell and a bonding pad for bonding of the solar cell;
providing a cooling substrate; and
attaching the bonding pad to a surface of the cooling substrate by means of a thermally conductive adhesive means.
According to an embodiment, electrically contacting the bonding pad to the cooling substrate can be achieved by a bonding wire. In this application, the term "bonding pad," is used in the general meaning of a flat surface of an electrically conductive material intended to make electrical contact with a device. Alternatively, the bonding pad can be attached to the surface of the cooling substrate by means of an adhesive means that is both thermally and electrically conductive. This alternative example for the inventive method may further comprise electrically contacting the bonding pad to the cooling substrate by a bonding wire in order to obtain an improved electrical connection between the bonding pad and the cooling substrate.

The adhesive means may be provided in form of a solder, conductive adhesive, adhesive tape, glue, etc. In a particular example, a glue or an adhesive tape made of epoxy containing aluminum oxide is used as the adhesive means.

According to the present invention, there is no need for some additional electrical insulation layer provided between the bonding pad and the cooling substrate as it is necessary in the art. Electrical contacting of the bonding pad and the cooling substrate can reliably obtained by means of the adhesive means and by providing electrical contact by a bonding wire. In particular, with respect to SCAs of the art, the overall number of galvanic elements and the number of different processed materials, that result in the formation of galvanic elements, can effectively be reduced according to the present invention.

Thus, according to the present invention, the number of expensive materials for the contact area can be reduced and production costs can be kept low and good reliability and long lifetime of the SCA are guaranteed.

The above-described examples for the inventive method may further comprise forming a contacting surface on at least a part of the bonding pad, for example, in a rectangular shape, and attaching the solar cell to the contacting surface. The solar cell may be contacted to the contacting surface by means of a thermally and/or electrically conductive adhesive or solder. The contacting surface may comprise or consist of a plating of a noble metal (e.g., gold, silver) or a non-noble metal (e.g., copper, tin, nickel or nickel-phosphorous). In particular, an electro-plated layer of a noble metal (e.g., gold, silver) or a non-noble metal (e.g., copper, tin, nickel or nickel-phosphorous) can be provided as the contact surface.

The bonding pad in the above-described embodiments may be provided in a geometric shape that (in a top view) comprises a superposition of a tetragon and an octagon such that one of two parallel sides of the octagon that are equally sized and longer than each of the other six sides of the octagon (that may be equally sized) is superposed with one of two equally sized parallel sides of the tetragon that are longer than the other two parallel equally sized sides of the tetragon. The other one of the equally sized parallel sides of the tetragon does not lie within the shape of the octagon.

According to an alternative embodiment, the bonding pad in the above-described embodiments may be provided in a geometric shape that (in a top view) comprises
a superposition of two trapezoids (that can be isosceles trapezoids) and a tetragon, wherein the longer one of the sides of the upper isosceles trapezoid that are perpendicular to the symmetry axis of the upper (isosceles) trapezoid is superposed on an upper side of the tetragon that is larger than that side (i.e., the longer one of the sides of the upper (isosceles) trapezoid that are perpendicular to the symmetry axis of the upper (isosceles) trapezoid) and the longer one of the sides of the lower (isosceles) trapezoid that are perpendicular to the symmetry axis of the lower (isosceles) trapezoid is superposed on the lower side of the tetragon that is larger than that side (the longer one of the sides of the lower (isosceles) trapezoid that are perpendicular to the symmetry axis of the lower (isosceles) trapezoid). The two (isosceles) trapezoids are superposed on the tetragon such that the smaller sides parallel to the ones superposed on the respective sides of the tetragon do not lie within the shape of the tetragon.

In alternative embodiments, the bonding pad has a hexagonal or rectangular shape.

In all alternative embodiments, the bonding pad is integrally formed in one single piece of these geometric shapes. Particular examples of the shapes are illustrated in FIGS. 3a and 3b as well as FIGS. 6a and 6b.

Also provided is a solar cell assembly, comprising
a solar cell attached to a bonding pad;
a cooling substrate;
wherein the bonding pad is attached to a surface of the cooling substrate by means of a thermally conductive adhesive means. The bonding pad may be, furthermore, electrically contacted to the cooling substrate by a bonding wire.

According to an alternative embodiment, a solar cell assembly is provided, comprising
a solar cell attached to a bonding pad;
a cooling substrate;
wherein the bonding pad is attached to a surface of the cooling substrate by means of a thermally and electrically conductive adhesive means.

In this alternative embodiment, the boding pad may furthermore be electrically contacted to the cooling substrate by a bonding wire.

In the above-mentioned examples of the inventive solar cell, the bonding pad may be provided in a geometric shape that comprises (in a top view)
a superposition of a tetragon, in particular, a rectangle, and an octagon such that one of two parallel sides of the octagon that are equally sized and longer than each of the other six sides of the octagon is superposed with one of two equally sized parallel sides of the tetragon that are longer than the other two parallel equally sized sides of the tetragon;
or a superposition of two (isosceles) trapezoids and a tetragon, wherein the longer one of the sides of the upper (isosceles) trapezoid that are perpendicular to the symmetry axis of the upper (isosceles) trapezoid is superposed on an upper side of the tetragon that is larger than that side and the longer one of the sides of the lower (isosceles) trapezoid that are perpendicular to the symmetry axis of the lower (isosceles) trapezoid is superposed on the lower side of the tetragon that is larger than that side.

Again, the other one of the equally sized parallel sides of the tetragon does not lie within the shape of the octagon and the two (isosceles) trapezoids are superposed on the tetragon such that the smaller sides parallel to the ones superposed on the respective sides of the tetragon do not lie within the shape of the tetragon.

The solar cell assembly may further comprise an electrical device, as, for example, a bypass diode or any device with a conductive surface insulated against the cooling substrate, that is connected to a surface of the solar cell by wires and positioned on a region of the bonding pad or the cooling substrate.

The present invention, furthermore, provides a bonding pad for bonding a solar cell and suitable for connection with a cooling substrate, wherein the bonding pad shows the geometric shape (in a top view) of
a superposition of a tetragon, in particular, a rectangle, and an octagon such that one of two parallel sides of the octagon that are equally sized and longer than each of the other six sides of the octagon is superposed with one of two equally sized parallel sides of the tetragon that are longer than the other two parallel equally sized sides of the tetragon;
or a superposition of two (isosceles) trapezoids and a tetragon wherein the longer one of the sides of the upper (isosceles) trapezoid that are perpendicular to the symmetry axis of the upper (isosceles) trapezoid is superposed on an upper side of the tetragon that is larger than that side and the longer one of the sides of the lower (isosceles) trapezoid that are perpendicular to the symmetry axis of the lower (isosceles) trapezoid is superposed on the lower side of the tetragon that is larger than that side.

Again, the other one of the equally sized parallel sides of the tetragon does not lie within the shape of the octagon and the two (isosceles) trapezoids are superposed on the tetragon such that the smaller sides parallel to the ones superposed on the respective sides of the tetragon do not lie within the shape of the tetragon.

Alternatively, the bonding pad may show the geometric shape of a hexagon or a rectangle.

The bonding pad may further comprise a contact surface for contacting the back side of a solar cell that is to be attached to the bonding pad, wherein the contact surface, in particular, consists of a plating of a noble metal (e.g., gold, silver) or a non-noble metal (e.g., copper, tin, nickel or nickel-phosphorous). In particular, an electro-plated layer of a noble metal (e.g., gold, silver) or a non-noble metal (e.g., copper, tin, nickel or nickel-phosphorous) can be provided as the contact surface.

In addition, a leadframe is provided comprising a plurality of the above-described bonding pads, wherein the bonding pads are densely packed in one plane. In particular, the leadframe may comprise the arrangement of bonding pads as illustrated in FIG. 5. Such a leadframe allows for very efficient processing by standard semiconductor technology.

In all of the above exemplary methods and devices the bonding pad and/or the cooling substrate may comprise or consist of an aluminum alloy, for example, of a 99.5% aluminum alloy. In particular, a cooling substrate of a 99.5% aluminum alloy and a bonding pad of a 99.5% aluminum alloy and comprising a contacting surface with an uppermost silver layer for contacting the backside of the solar cell in combination with attachment of the bonding pad to the cooling substrate by an epoxy glue comprising aluminium oxide and electrically contacting the bonding pad with the cooling substrate by aluminium wiring represents a particularly cost-effective configuration when used in the above-described examples.

BRIEF DESCRIPTION OF THE DRAWINGS

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION OF THE INVENTION

Figure 1A:
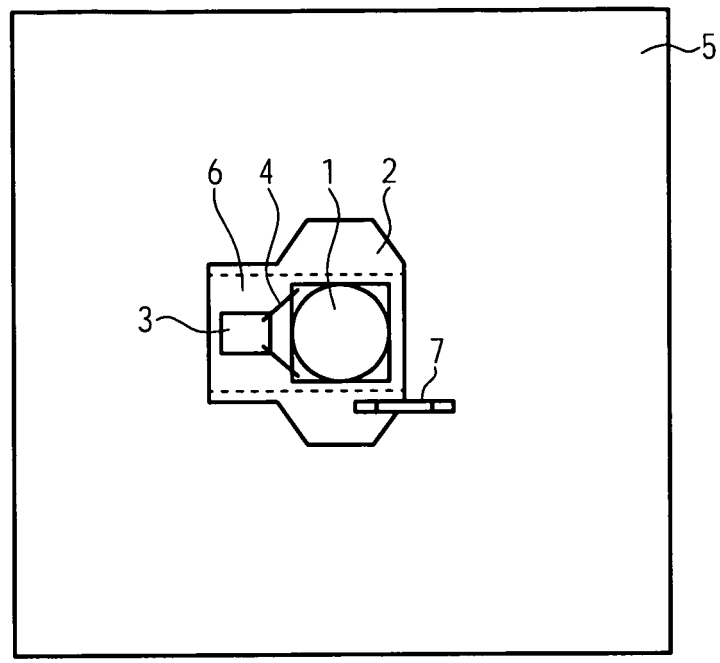
FIGS. 1a and 1b illustrate an example of an SCA comprising a cooling substrate, a bonding pad, a solar cell and an electrical device contacted with the solar cell according to the invention.

An SCA configuration manufactured in accordance with the present invention is illustrated in FIGS. 1a (top view) and 1b (side view). According to the shown example, the SCA comprises a solar cell 1, a bonding pad 2, a separate electronic device 3 (for example, a bypass diode or any device with a conductive surface insulated against a cooling substrate) that is electrically contacted with the upper surface of the solar cell 1 by means of bonding wires 4 and a cooling substrate 5. It is noted that a pad, for example, an aluminium pad can be provided in place of the electronic device 3. It is preferred that the bonding pad 2 and the cooling substrate 5 are made of the same material. According to an example, this material is an aluminum alloy, in particular, a 99.5% aluminum alloy. Thermal stresses and galvanic elements between the bonding pad 2 and the cooling substrate 5 are largely avoided by the choice of the same material.

In principle, the cooling substrate 5 consists of a plane metal and shall provide thermal cooling and may also serve as an electrical conductor. The dimensions and, particularly, the thickness of the plane metal (as the thickness of the bonding pad 2) can be selected in accordance with the desired cooling performance. The choice of a 99.5% aluminum alloy for the cooling substrate 5 allows for reliably contacting to thin-wire or thick-wire or ribbon bond connections as well as connecting to a secondary optics of a concentrator solar photovoltaic application made of aluminium.

The bonding pad 2 comprises a contact surface 6 covering completely or partly the bonding pad 2. The contact surface 6 consists of a material that is suitable for contacting the back side of the solar cell 1. For example, the contact surface 6 may consist of a plating of a noble metal (e.g., gold, silver) or a non-noble metal (e.g., copper, tin, nickel or nickel-phosphorous). In particular, an electro-plated layer of a noble metal (e.g., gold, silver) or a non-noble metal (e.g., copper, tin, nickel or nickel-phosphorous) can be provided as the contact surface 6. The contact surface 6 can particularly be provided in a rectangular shape. Alternatively, the solar cell 1 may be directly connected to the aluminium bonding pad 2. Furthermore, electrical contact between the bonding pad 2 and the cooling substrate 5 is provided by a bonding wire 7.

Figure 1B:
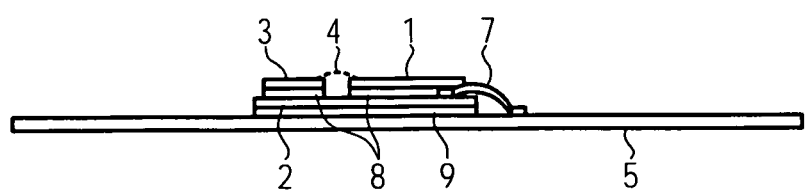

The bonding pad 2 is attached to the cooling substrate 5 by means of a thermally conductive adhesive means 9 (see FIG. 1b). The adhesive means 9 can be a thermally conductive glue, solder or adhesive tape or foil, for example. The thermally conductive adhesive means 9 may also provide for electrical conductivity. However, in order to save manufacturing costs, an electrically non-conducting adhesive means 9 may be provided, for instance, glue or an adhesive tape made of epoxy containing aluminum oxide. In this case, electrical connection can be provided by bond wiring 7, in particular, by means of an aluminum wire, as it is illustrated in FIGS. 1a and 1b.

The bonding pad 2 shows a geometric shape that facilitates thermal cooling and may comprise a portion that is appropriate for positioning a device 3, for example, a bypass diode or an electrically isolated contact pad, to be electrically contacted with the upper surface of the solar cell 1 by means of bonding wires 4. In the shown example (see FIG. 1a) the bonding pad 2 has a shape of an octagon superimposed by a tetragon such that one of two parallel sides of the octagon that are equally sized and longer than each of the other six sides of the octagon is superposed with one of two equally sized parallel sides of the tetragon that are longer than the other two parallel equally sized sides of the tetragon.

Contacting of the solar cell 1 with the bonding pad 2 can be realized by means of a solder 8 or thermally and/or electrically conductive adhesive 8 as it is shown in FIG. 1b. According to the present example, device 3 is similarly contacted by the solder 8 or conductive adhesive 8 to the bonding pad 2. A preferred example for the adhesive 8 is a silver glue for the case that the uppermost layer of the contact surface 6 comprises silver.

According to a particular embodiment, at least one of the bonding pad 2 and the cooling substrate 5 consists of a 99.5% aluminum alloy and the bonding pad 2 comprises a galvanic layer or plating with an exposed silver surface at the top. On the silver surface, a conductive silver adhesive is formed for electrical and thermal connection with the backside of the solar cell 1. The same or a different conductive silver adhesive is used for the electrical and thermal connection of the bonding pad 2 and device 3.

Figure 2A:
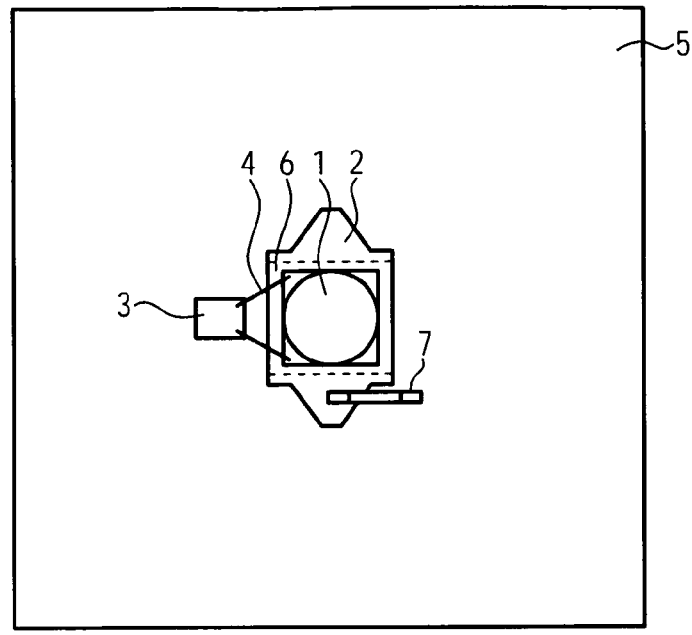
FIGS. 2a and 2b illustrate another example of an SCA comprising a cooling substrate, a bonding pad, a solar cell and an electrical device contacted with the solar cell according to the invention.
Figure 2B:
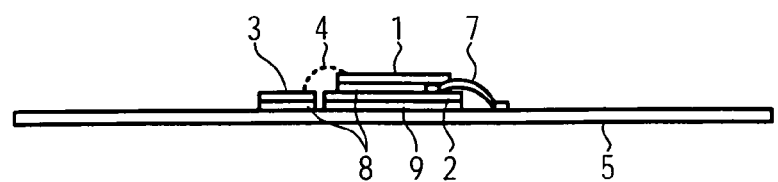

FIGS. 2a and 2b illustrate another embodiment of an SCA comprising a cooling substrate, a bonding pad, a solar cell and an electrical device contacted with the solar cell according to the invention. As compared to the example shown in FIGS. 1a and 1b, the bonding pad 2 has a different shape and does not include a portion for positioning device 3 that is connected to the upper surface of the solar cell 1 by wires 4. The bonding pad 2 shown in FIG. 2a is shaped in the form of a polygon with twelve corners and sides. In detail, the shape of the bonding pad 2 is given by a superposition of two (isosceles) trapezoids and a tetragon. The longer one of the sides of the upper (isosceles) trapezoid that are perpendicular to the symmetry axis of the upper (isosceles) trapezoid is superposed on an upper side of the tetragon that is larger than that side. Similarly, the longer one of the sides of the lower (isosceles) trapezoid that are perpendicular to the symmetry axis of the lower (isosceles) trapezoid is superposed on the lower side of the tetragon (parallel to the upper side of the tetragon) that is larger than that side (see FIG. 2a).

As in the example described with reference to FIGS. 1a and 1b, the bonding pad 2 comprises a contact surface 6 partly covering the bonding pad 2. The contact surface 6 is rectangular-shaped and consists of a material that is suitable for contacting the back side of the solar cell 1, for example, gold, silver, copper, tin, nickel or nickel-phosphorous. The solar cell 1 is contacted with the bonding pad via a solder 8 or thermally and/or electrically conductive adhesive 8. The device 3 is positioned spaced apart from the bonding pad 2 and it is contacted with the cooling substrate 5 via another solder 8 or a thermally and/or electrically conductive adhesive 8 of the same or a different material as the one used for contacting the solar cell 1 with the bonding pad 2 (FIG. 2b).

Figure 4:
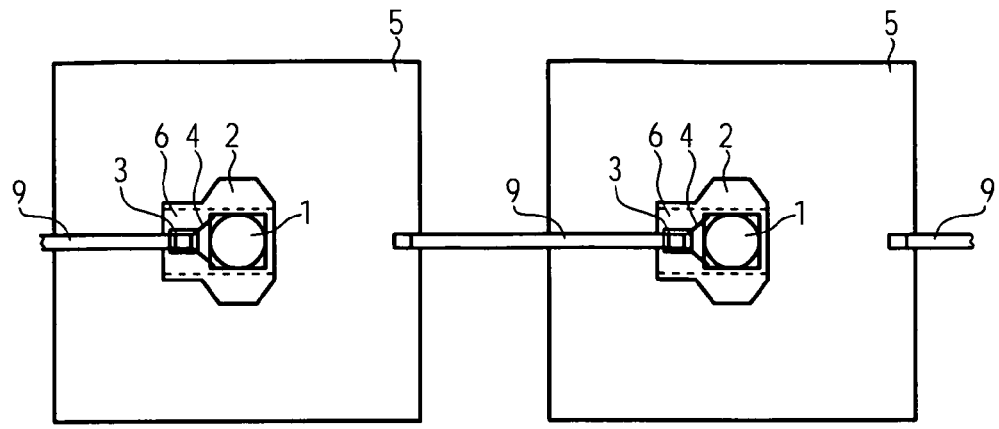
FIG. 4 illustrates thick-wire wiring of individual SCAs formed according to examples of the present invention.

Individual SCAs according to the examples of FIGS. 1a and 1b or FIGS. 2a and 2b can be wired as it is shown in FIG. 4. Thick-wires 9, for example, aluminium wires, connect to the bonding pads 2 of the SCAs. A secondary optics or its mount made of aluminum can readily be connected to the cooling substrate 5 by means of laser welding, etc.

Fabrication of the bonding pads can be realized, for example, as follows. Rectangular pieces of aluminum (or a different metal) are provided. Stripes of noble or non-noble metal are formed on this rectangular piece of aluminum to form the future contact surfaces. Then the bonding pads are formed by stamping, to form a so called leadframe 10 shown in FIG. 5. The position and shape of the pad are designed such that a very high density of bonding pad can be arranged on a single rectangular piece of aluminium, such that a single stamping step is sufficient to form the pad. Also, the bonding pads are designed and positioned such that the continuous stripes of noble or non-noble metal coated on the surface of the aluminium piece are appropriately positioned on the pad, after stamping, for receiving the solar cell and possibly the diode.

The assembling of the bonding pad, the cooling substrate and the solar cell may comprise the following. The solar cells and, possibly, the diode are successively assembled on the bonding pad being part of the leadframe. Then, each bonding pad of the leadframe is "detached" and joined/attached to the cooling substrate. This is very preferable in term of manufacturability, since the small elements (diode, solar cells) are picked and placed on the leadframe. This procedure can be performed in an automated industrial way with current equipment. However, care should be taken not to deteriorate those electronic components during the assembly of the bond pad with the cooling substrate. In this procedure there is a need to pick and place the bond pad with the electronic components mounted on them. Therefore, the bond pad should exhibit some "handling area" that typically is not coated with a noble or non-noble metal. The handling area will allow the "pick-and-place" tool to manipulate the bond pad.

Figure 3A:
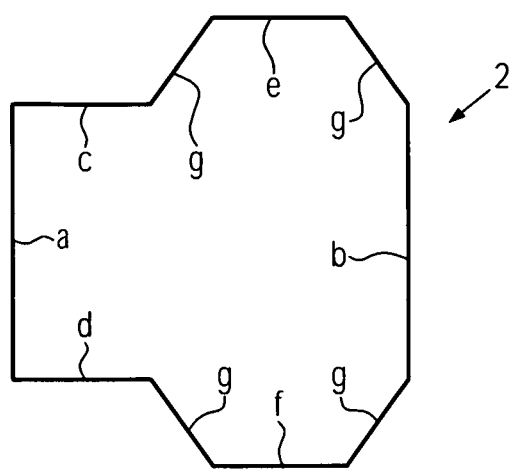
FIGS. 3a and 3b illustrate exemplary geometric shapes of bonding pads according to examples of the present invention.
Figure 3B:
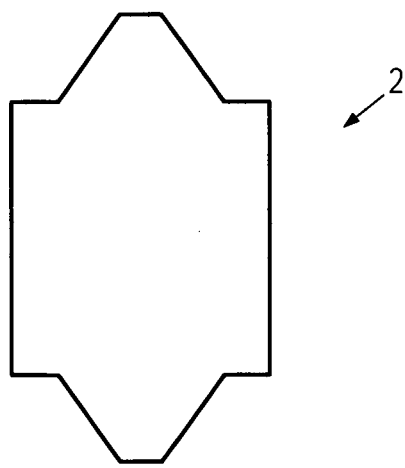

By the areas defined by the sides indicated by e and g and by f and g of FIG. 3a, as well as by the trapezoid areas of FIG. 3b, handling areas are defined. Moreover, the handling area is helpful since it puts some distance between the devices (solar cell, diode) with the contour of the bond pad that can exhibit a high temperature during the assembling step with the cooling substrate.

Figure 5:
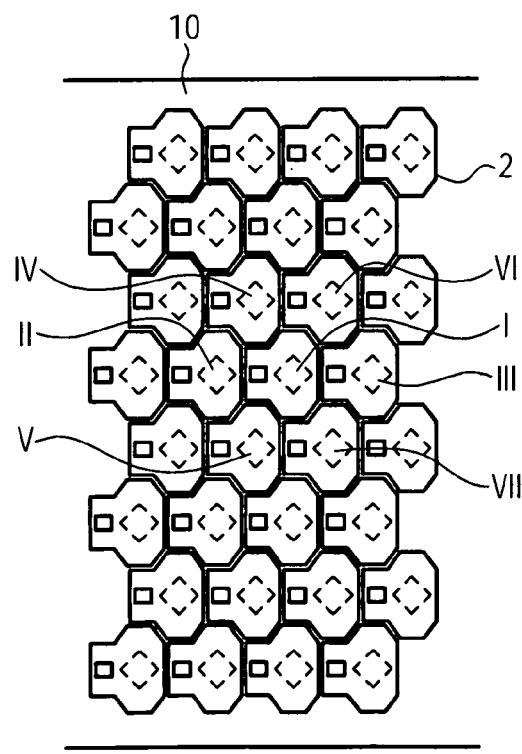
FIG. 5 illustrates a leadframe comprising bonding pads according to an example of the present invention.

In the present invention, bonding pads 2 of particular geometric shapes are provided as it is also illustrated in FIGS. 3a and 3b. The bonding pads 2 provided by the present invention are particularly suitable for mass production and processing by semiconductor technology. In FIG. 5, a leadframe 10 comprising a plurality bonding pads 2 is illustrated. The bonding pads are densely and planar packed on a metal strip 10 that can be promoted in a production line. In the shown example, a plurality of bonding pads 2 described with reference to FIGS. 1a and 1b and as shown in FIG. 3a form the leadframe 10. The uppermost and lowermost bonding pads 2 and the leftmost and rightmost bonding pads 2 of FIG. 5 may be designated as boundary bonding pads. All bonding pads that are completely neighbored by other bonding pads are designated as inner bonding pads.

The inner bonding pads are arranged such that for each of these bonding pads I the following holds:

A) A long side (indicated by a in FIG. 3a) of the rectangle of the bonding pad I (being parallel to a long side of the octagon of the same bonding pad) is positioned adjacent to a long side of the octagon of a first other bonding pad II and a long side (indicated by b in FIG. 3a) of the octagon of the same bonding pad I is positioned adjacent to a long side of the rectangle of second other bonding pad III.

B) A first short side (shorter than the long side and indicated by c in FIG. 3a) of the rectangle of the bonding pad I is positioned adjacent to a first short side of an octagon of a third other bonding pad IV and a second short side (indicated by d in FIG. 3a) parallel to the first short side of the rectangle of the bonding pad I is positioned adjacent to a first short side of an octagon of a fourth other bonding pad V.

C) A first short side (shorter than the long side and indicated by e in FIG. 3a) of the octagon of the bonding pad I is positioned adjacent to a first short side of the rectangle of a fifth other bonding pad VI and a second short side (parallel to the first one and indicated by f in FIG. 3a) of the octagon of the bonding pad I is positioned adjacent to a first short side of the rectangle of a sixth other bonding pad VII.

D) The diagonal sides (indicated by g in FIG. 3a) of the octagon of the bonding pad I are adjacent to respective diagonal sides of the third to sixth octagons IV to VII as shown in FIG. 5.

In a similar manner, the bonding pads described with reference to FIGS. 2a and 2b and as shown in FIG. 3b can be arranged in a dense arrangement. In a particular arrangement, diagonal sides of one bonding pad 2 illustrated in FIG. 3b are positioned adjacent to diagonal sides of other bonding pads 2 of the same shape in a leadframe comprising the bonding pads 2 shown in FIG. 3b.

Whereas particular geometric shapes of the bonding pad 2 and the corresponding arrangement of the same in a leadframe are described above, the inventive bonding pads 2 are not restricted to that.

Figure 6A:
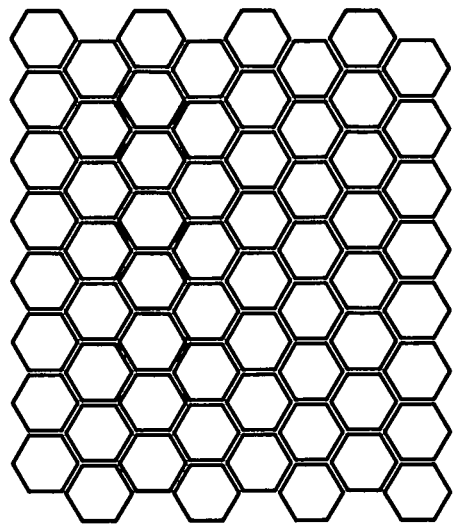
FIGS. 6a and 6b illustrate further exemplary geometric shapes of bonding pads arranged in leadframes according to examples of the present invention.
Figure 6B:
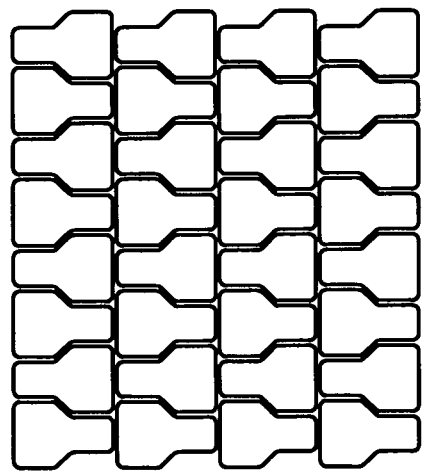

Further alternative appropriate shapes of the inventive bonding pad 2 and arrangements of the same in a leadframe are illustrated in FIGS. 6a and 6b. Compared with the geometric shapes of the above-described bonding pads, the shapes of the bonding pads shown in FIGS. 6a (hexagon) and 6b (two rectangles) are simpler. No particular handling area is defined. In this case, the dimensions of the bonding pad can be reduced and manufacture of the bonding pad is cheaper. Such bonding pads are particularly useful for the following procedure of assembling the bonding pad, the cooling substrate and the solar cell. In a first step, the bonding pad is assembled on the cooling substrate. In a second step, the solar cell and possibly the diode are connected to the bonding pad. However, the manufacture is less easy (in terms of automation) as compared to the above-described method of assembly, because the devices are to be positioned on rather large substrates (cooling substrate and bonding pad).

All previously discussed embodiments are not intended as limitations but serve as examples illustrating features and advantages of the invention. It is to be understood that some or all of the above-described features can also be combined in different ways.

What is claimed is:

1. A method of forming a solar cell array including two or more solar cell assemblies operatively coupled together, the method comprising:
   forming at least two solar cell assemblies, wherein forming each solar cell assembly of the at least two solar cell assemblies comprises:

providing a solar cell having an upper front side and a lower back side;

providing a bonding pad separate from the solar cell and also having an upper front side and a lower back side, the bonding pad consisting essentially of a metal or metal alloy;

forming a plating of a noble or non-noble metal on a portion of the upper front side of the bonding pad, providing a contact surface for the bonding pad, wherein a surface area of the bonding pad is larger than a surface area of the solar cell;

after forming the plating of the noble or non-noble metal on the portion of the upper front side of the bonding pad, attaching the lower back side of the solar cell to the contact surface by a first adhesive;

providing a device on a portion of the bonding pad located laterally beside the solar cell, providing a cooling substrate comprising a single continuous structure, the cooling substrate also consisting essentially of the metal or metal alloy;

after attaching the lower back side of the solar cell to the contact surface and providing the device on the portion of the bonding pad located laterally beside the solar cell, bonding the lower back side of the bonding pad to a cooling substrate by a second adhesive comprising a thermally conductive, electrically non-conductive adhesive or adhesive member, wherein the bonding pad is in thermal communication with the cooling substrate through the second adhesive;

after bonding the lower back side of the bonding pad to the cooling substrate, physically connecting at least one bonding wire to the bonding pad and to the cooling substrate to electrically connect the lower back side of the solar cell to the cooling substrate, wherein the bonding pad is in electrical communication with the cooling substrate through the at least one bonding wire located laterally beside and separate from the second adhesive;

extending at least one additional bonding wire electrical connecting the device and the upper front side of the solar cell; and establishing electrical contact between the device of a first solar cell assembly of the at least two solar cell assemblies and the cooling substrate of a second solar cell assembly of the at least two solar cell assemblies using a conductive member extending therebetween.

2. The method according to claim 1, wherein the bonding pad of each solar cell assembly is part of a common leadframe at the time the solar cell is attached to the contact surface of the bonding pad and at the time the device is located on the bonding pad.

3. The method according to claim 1, wherein the second adhesive is a glue or adhesive tape made of epoxy containing aluminum oxide.

4. The method of claim 1, wherein providing the contact surface for the bonding pad comprises providing the contact surface on a complete front side of the bonding pad, wherein a complete back side of the solar cell is attached to a complete contact surface of the bonding pad, and the first adhesive comprises a silver glue.

5. The method according to claim 1, wherein the bonding pad comprises a geometric shape that comprises:
a superposition of a tetragon and an octagon such that one of two parallel sides of the octagon that are equally sized and longer than each of the other six sides of the octagon is superposed with one of two equally sized parallel sides of the tetragon that are longer than the other two parallel equally sized sides of the tetragon; or
a superposition of upper and lower trapezoids and a tetragon wherein one of the sides of the upper trapezoid that is perpendicular to the symmetry axis of that trapezoid is superposed on a side of the tetragon that is larger than that side of the upper trapezoid and one of the sides of the lower trapezoid that is perpendicular to the symmetry axis of the lower trapezoid is longer than its other sides and is superposed on the lower side of the tetragon that is larger than that side; or a hexagon or rectangle.

6. The method according to claim 1, wherein the bonding pad and the at least one bonding wire comprise aluminum.

7. The method according to claim 1, wherein the noble or non-noble metal comprises silver.

8. The method according to claim 1, wherein the device comprises at least one of a bypass diode or an electrically isolated contact pad.

9. The method according to claim 1, wherein the cooling substrate consists essentially of a single integral structure.

* * * * *

UNITED STATES PATENT AND TRADEMARK OFFICE
CERTIFICATE OF CORRECTION

PATENT NO. : 9,590,126 B2
APPLICATION NO. : 13/575281
DATED : March 7, 2017
INVENTOR(S) : Martin Ziegler and Sascha Van Riesen It is certified that error appears in the above-identified patent and that said Letters Patent is hereby corrected as shown below:

In the Claims

Claim 1, Column 9, Line 39, change "bonding wire electrical" to --bonding wire electrically--

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*